(12) United States Patent
Braun et al.

(10) Patent No.: US 7,700,166 B2
(45) Date of Patent: Apr. 20, 2010

(54) PROCESS FOR EVAPORATING HIGH-MELTING MATERIALS

(75) Inventors: Wolfgang Braun, Berlin (DE); Albrecht Fischer, Löchgau (DE)

(73) Assignees: CreaTec Fischer & Co. GmbH, Erligheim (DE); Forschungsverbund Berlin e.V., Berlin (DE)

( * ) Notice: Subject to any disclaimer, the term of this patent is extended or adjusted under 35 U.S.C. 154(b) by 886 days.

(21) Appl. No.: 11/443,748

(22) Filed: May 31, 2006

(65) Prior Publication Data

US 2006/0278167 A1    Dec. 14, 2006

Related U.S. Application Data

(60) Provisional application No. 60/687,823, filed on Jun. 6, 2005.

(51) Int. Cl.
*C23C 16/448*    (2006.01)

(52) U.S. Cl. .................. 427/585; 427/593; 427/595; 118/723 EB

(58) Field of Classification Search .............. 427/248.1, 427/585, 595, 596, 593; 118/723 EB
See application file for complete search history.

(56) References Cited

U.S. PATENT DOCUMENTS

| | | | | |
|---|---|---|---|---|
| 3,634,647 | A | * | 1/1972 | Dale, Jr. ................ 219/121.15 |
| 4,050,905 | A | * | 9/1977 | Swinehart ..................... 23/301 |
| 4,152,478 | A | * | 5/1979 | Takagi ......................... 428/221 |
| 4,197,814 | A | * | 4/1980 | Takagi et al. ................ 118/726 |
| 4,514,437 | A | * | 4/1985 | Nath ........................... 427/566 |
| 5,039,626 | A | * | 8/1991 | Koma et al. ..................... 117/8 |
| 5,122,389 | A | | 6/1992 | Yasunaga |
| 5,522,955 | A | | 6/1996 | Brodd |
| 5,736,073 | A | * | 4/1998 | Wadley et al. ................ 264/10 |
| 5,880,069 | A | * | 3/1999 | Nakao et al. ................. 505/329 |
| 5,997,802 | A | * | 12/1999 | Holcombe et al. .......... 266/275 |
| 2003/0153180 | A1 | * | 8/2003 | Marunaka et al. ........... 438/680 |
| 2003/0184216 | A1 | * | 10/2003 | Yano et al. .................. 313/505 |
| 2004/0035366 | A1 | * | 2/2004 | Keum et al. ................. 118/726 |
| 2004/0200416 | A1 | * | 10/2004 | Schuler et al. ........... 118/723 E |
| 2008/0050581 | A1 | * | 2/2008 | Miwa et al. ................. 428/332 |

FOREIGN PATENT DOCUMENTS

| | | |
|---|---|---|
| EP | 0 121 443 | 10/1984 |
| EP | 0 803 893 | 10/1997 |
| EP | 1 325 969 | 7/2003 |
| JP | 08 236 449 | 9/1996 |
| JP | 2005194552 | 7/2005 |

OTHER PUBLICATIONS

Vrestal, J., et al., "Thermodynamic Parameters of Liquid Ternary . . . Alloys". Monatshefte fur Chemie 127, pp. 135-142 (1996).*
Evaporation Sources and Heating Methods notes from the Kurt J. Lesker Company. pp. 9-2 to 9-3. No date available.*
R.R. Asamoto et al. Tungsten-Rhenium Thermocouples for use at High Temperatures, The Review of Scientific Instruments, vol. 38, No. 8, Aug. 1967, pp. 1047-1052.

* cited by examiner

*Primary Examiner*—Bret Chen
(74) *Attorney, Agent, or Firm*—Schnader Harrison Segal & Lewis LLP

(57) ABSTRACT

A process for the evaporation of a high-melting material in an evaporator cell having a crucible for receiving the material to be evaporated, and a heating device with a heating resistor for the resistance heating of the crucible, the heating resistor being provided as an electron emitter for the electron beam heating of the crucible.

9 Claims, 3 Drawing Sheets

PROCESS FOR EVAPORATING HIGH-MELTING MATERIALS

FIELD OF THE INVENTION

The invention concerns an evaporator cell. In particular an effusion evaporator cell for converting a high-melting material to be evaporated into the gaseous phase (evaporation, sublimation), and a process for evaporating high-melting material to be evaporated.

TECHNICAL BACKGROUND

The evaporation of materials for depositing thin layers is a widespread process, e.g., in technical physics and in semiconductor technology. When using materials that pass into the gaseous phase only at extremely high temperatures (e.g., above 2000° C.), there are special requirements for the evaporation technology. At first, the evaporator must be sufficiently temperature-stable in order to heat the material to be evaporated to the desired evaporation temperature. Secondly, a precise and reproducible adjustment of an evaporation rate is frequently rendered difficult due to the high energy currents necessary for achieving the evaporation temperature. Finally, there is a tendency at the high temperatures to reactions of the material to be evaporated that can be desired in the case of reactive evaporation but must be avoided as regards any impurities present.

There are special challenges in the production of thin-layer components for CMOS technology. High-melting ceramic materials, e.g., rare-earth oxides are increasingly used for forming insulating layers in the course of rising integration density. A reactive evaporation of ceramic materials in which the desired stoichiometric composition is adjusted in the insulating layer by a partial oxygen pressure during the evaporation is normally excluded in CMOS technology since undesired oxide layers are formed by the oxygen on free silicon surfaces of the thin-layer component. There is therefore interest in a non-reactive vapor deposition in which the material to be evaporated already has the desired stoichiometric composition of the insulating layer.

The following problems in the evaporation or sublimation of stoichiometric material to be evaporated are known from practice. A first problem occurs if the material to be evaporated is unstable in the ambient atmosphere. This is the case, e.g., for the ceramic $Pr_2O_3$, that decomposes under the influence of water vapor into a stoichiometrically changed oxidation state that for its part liberates undesired oxygen during the evaporation. Thus, the evaporator can only be charged at great expense with a very pure material that is unstable in the atmosphere. If a stabilizing additive substance is added to the material to be evaporated, a purification for eliminating the additive substance would be required before the evaporation of the material to be evaporated that is, however, excluded with the conventional evaporator technology for the following reasons.

The temperatures required for evaporating high-melting materials are typically produced with electron beam evaporators. In general, there is the problem in the direct heating of the material to be evaporated by an electron beam that only the surface of the material to be evaporated, is heated with the electron beam so that an inhomogeneous heating of the material to be evaporated results. If the electron beam is directed onto the material to be evaporated a strong local surface heating up to evaporation takes place but no uniform heating of the material to be evaporated. Therefore, an electron beam evaporator is not suitable for sublimation purification of the material to be evaporated.

Similar problems result from the fact that the ceramic materials of interest, e.g., for CMOS technology are frequently present as granulates or powder that render a reliable charging of evaporators difficult. The charging of the evaporator with sintered bodies of the material to be evaporated is desired in particular for large-scale industrial applications. However, the sintering process also requires the addition of a binding agent that would have to be removed before the evaporation by a sublimation purification.

It is also possible to counter the cited stability problem in that an oxidation state of the material to be evaporated that is stable in the atmosphere is charged into the evaporator and is converted before the evaporation into the desired stoichiometric oxidation state by a tempering. For example, the ceramic material $Pr_6O_{11}$, that is stable in air, is available in high purity but requires a tempering for conversion into $Pr_2O_3$. A homogeneous tempering with conventional electron beam evaporators is not possible on account of the local surface heating of the material to be evaporated.

It can be noticed in general that the temperature of the material to be evaporated can not be adjusted sufficiently precisely in a reproducible manner with a conventional electron beam evaporator in order to achieve a certain purification effect or tempering effect or to adjust a certain evaporation rate. This problem cannot be solved with a conventional thermal resistance heating of a crucible with a heating resistor and a temperature control with a thermocouple since in this case there is the disadvantage that the conventional resistance heating evaporators are only designed for temperatures below 1900° C.

The cited problems in the evaporation of high-melting materials exist not only in CMOS semiconductor technology but also in other evaporation tasks for purposes of coating or of purification.

Another general problem of conventional evaporation technology for high-melting materials consists in that the evaporator characteristic of an electron beam evaporator can be adjusted to be sufficiently stable only in a limited manner. The inhomogeneous surface heating of the material to be evaporated brings about an irregular change of the surface of the material to be evaporated during the evaporation and with it a change of the evaporator characteristic. However, it is essential for applications in thin-layer technology to be able to control the homogeneity of layer separation on a substrate during the entire coating procedure. For this reason, there is interest in using effusion cells for adjusting a certain vapor beam of the material to be evaporated. However, effusion cells for high-melting materials, especially for large-scale industrial purposes, have not yet been available.

OBJECTIVE OF THE INVENTION

The invention has the objective of providing an improved evaporator cell for transferring high-melting materials into the gaseous phase, in particular an improved effusion cell with which the disadvantages of conventional evaporation technology are overcome and that makes possible in particular a precise, reproducible and chronologically stable adjustment of a predetermined temperature of the material to be evaporated. The evaporator cell should be suitable in particular for an operation above 1900° C. According to a further aspect the evaporator cell should be suitable for stable, large-scale industrial use for evaporating rather large amounts of material to be evaporated than is possible with the conventional technology. The objective of the invention also consists in providing an improved process for evaporating high-melting materials, especially at temperatures above 1900° C., with which the problems of the conventional technologies can be overcome.

SUMMARY OF THE INVENTION

These objectives are solved by an evaporator cell and a evaporation process according to an illustrative embodiment of the invention.

As concerns the apparatus, the invention is based on the general technical teaching of providing in a evaporator cell with a crucible for receiving a material to be processed a combination of a resistance heating and an electron beam heating with which the temperature of the crucible can be adjusted. Both heating types act from the outside onto the crucible. A single heating device is provided that contains a structural component for transferring energy onto the exterior of the crucible that is designed both for resistance heating as well as for irradiating the crucible with electrons. The inventors have found that a heating resistor for an in principle known, indirect heating of the crucible can be used as electron emitter. The electron emission can be generated in and above a temperature range in which the temperature of the crucible can be adjusted with the resistance heating. Therefore, a stepless transition from the resistance heating to the electron beam heating is advantageously made possible with the evaporator cell in accordance with the invention. Thus, the temperature of the material to be worked can be advantageously adjusted in the entire temperature range in accordance with the concrete requirements. For example, a purification of the material from readily volatile components can be provided at first in a low temperature range and the conversion of the material into the gaseous phase can be provided in a higher temperature range.

A particular advantage of the invention resides in the fact that the crucible temperature can be directly adjusted with the combined resistance heating and electron beam heating. Due to the high thermal conductivity of the crucible materials that can be used in the temperature range of interest such as, e.g., tungsten or tantalum, the thermal energy transferred into the crucible is transformed uniformly onto the material contained in the crucible. In contrast to the conventional electron beam evaporation not only the surface of the material is heated but a homogenous heating in the crucible is achieved. This achieves the following advantageous effects for the practical usage of the evaporator cell. In the first place, a temperature control is made possible. The temperature can be selected with increased precision as a function of the concrete application and of the material. In the second place, new possibilities of use are opened up for the evaporator cell such as, e.g., for purifying high-melting material. In the third-place, the material to be worked can be converted into the gaseous phase in the evaporator cell and exit from the evaporator cell with a predetermined characteristic. The characteristic is determined by the geometry of the evaporator cell and not as in conventional electron beam evaporators by random processes on the material surface.

Thus, the evaporator cell according to the invention is preferably an effusion cell. It is especially suitable for the precise and reproducible separation of layers of high-melting materials, e.g., in semiconductor technology. Temperatures above 2500° C., in particular up to 3000° C. are achieved with the evaporator cell. The evaporator cell according to the invention has an expanded area of application. It can be used, e.g., for purifying high-melting materials and/or for converting high-melting, optionally purified materials into the gaseous phase.

In the following, the material to be worked is designated as "material to be evaporated", independently of the concrete task of the evaporator cell and independently of the type of phase transition as evaporation or sublimation. In a corresponding manner the transition into the gaseous phase is designated in the following as "evaporation" independently of the fact whether an evaporation takes place in the concrete instance from the melt or a sublimation takes place from the solid state.

If the heating resistance to the combined resistance heating and electron beam heating in accordance with a preferred embodiment of the invention extends at several sides of the crucible, the precision and reproducibility of the temperature adjustment can be advantageously improved. The crucible typically comprises a crucible bottom and a side wall surrounding an inner chamber of the crucible. The distribution of the heating resistor to several sides of the crucible means that the heating resistor (or resistor elements) is/are arranged distributed on the outside of the side wall. It is preferably provided, especially for evaporating rather large amounts of material to be evaporated, that the crucible has an elongated form. The characteristic size (e.g., the diameter) of the crucible bottom is less than the extension (e.g., height of the side walls). In this embodiment of the invention, the heating resistor preferably extends along the longitudinal extension on the outside of the crucible. Thus, the temperature adjustment of the entire material to be evaporated can advantageously be achieved with a shortened reaction time.

If according to an especially preferred variant the crucible has the form of a cylinder, e.g., with a circular or elliptical base surface, a simplified construction of the evaporator cell advantageously results. Furthermore, the temperature distribution in the material to be evaporated is largely constant in all phases of a evaporation procedure. According to an alternative variant the crucible has the form of a cone that widens out from the crucible bottom to the crucible opening. The conically formed crucible has the advantage that rather large surfaces can be homogenously evaporated.

According to an especially preferred embodiment of the invention the evaporator cell is provided with at least one temperature measuring device with which an operating temperature of the evaporator cell can be detected. Although the use of a temperature measuring device is known as such from conventional resistance heatings, the measuring of the temperature directly given in the evaporator cell according to the invention constitutes significant progress. The inventors have found that the operating temperature can be reliably measured during the resistance heating as well as during the electron beam heating. A disturbance of the temperature measuring during the electron beam operation could be avoided. The homogenous crucible heating makes possible the reliable measuring of temperature values and/or the monitoring of a predetermined time regime of the temperature control during a evaporation process. The temperature measuring device can be arranged in the crucible or directly on the crucible, e.g., on or adjacent to a wall of the crucible. However, for a reliable and problem-free measuring the arrangement of the temperature measuring device is preferably provided in the evaporator cell at a distance from the outside of the crucible, e.g., below the crucible bottom. Alternatively, the temperature measuring device can be arranged outside of the evaporator cell for an optical temperature measuring.

The temperature measuring can take place with various types of temperature measuring devices such as, e.g., radiation bolometers. For the optical temperature measuring a radiation detector is preferably provided outside of the evaporator cell with which a temperature-dependent thermal radiation emanating from the outside wall or inside wall of the crucible can be detected through a viewing window or an opening in a shielding device. However, a thermocouple is provided with particular preference. Thermocouples, in particular based on tungsten and rhenium, are available in the high-temperature area of interest (see, e.g., R. R. Asamoto et al. in "The Review of Scientific Instruments", vol. 38, 1967, p. 1047). Furthermore, a thermocouple advantageously has a small space requirement so that a thermal conduction to the outside can be minimized and undesired disturbances in the operation of the evaporator cell can be avoided.

According to a further preferred embodiment of the invention the crucible of the evaporator cell comprises a holding device for positioning the crucible in a thermally insulating manner relative to the other parts of the evaporator cell and in particular relative to a carrier. The holding device constitutes a mechanical holding that leaves the outer surface of the crucible substantially free when the latter is formed from an electrically conductive material. The holding device is preferably provided in this instance on the crucible bottom so that the side walls of the crucible are free for the transfer of heat from the heating device. If the holding device consists of an electrically conductive material it can advantageously function at the same time in addition to the mechanical holding as a high-voltage contact for the crucible. If the crucible consists of an electrically non-conductive material the holding device is formed in such a manner that it covers the greatest part of the outer surface of the crucible. In this instance, a positive-fitting connection between outer surface of the crucible and the inside of the holding device is preferably provided.

If the holding device is formed by a structural component with a hollow profile, this can yield advantages for reducing the thermal conduction from the crucible to the environment and for a stable positioning of the crucible even in extremely high temperatures. The holding device is, e.g., a hollow cylinder or a hollow cone attached to the bottom of the crucible. The cylindrical or conical holding device has an especially high mechanical stability. The crucible is held stiff and all over with a protection against torsion and bending.

A space is advantageously created by the hollow profile, that forms the high-voltage contact of the crucible, in the direct vicinity of the crucible in which space the operating temperature of the crucible can be measured and in which a reduced field strength is given. The temperature measuring device is therefore preferably provided in the interior of the holding device for measuring the temperature. The holding device has, e.g., a lateral opening through which the temperature measuring device, e.g. the thermocouple, can be introduced into the holding device. Alternatively, the thermocouple can be introduced axially from the carrier from below into the holding device. The positioning of the thermocouple in the hollow profile of the holding device has the particular advantage that a shielding of the thermocouple on all sides, especially against the high field strengths during operation of the heating device as an electron beam heating, is achieved and undesired high-voltage flashovers are avoided.

A receptacle is preferably provided on the carrier into which the holding device can be inserted. The receptacle has, e.g., the form of a cylindrical or conical shaft whose inner form is adapted to the outer form of the hollow profile of the holding device. The inserted holding device advantageously forms a firm mechanical contact with the carrier so that a tipping of the crucible during operation of the evaporator cell is avoided.

The evaporator cell according to the invention advantageously makes a precise temperature adjustment possible in the crucible. To this end, a control device is preferably provided with which the heating device can be adjusted. The control device contains at least one but preferably both of the following control circuits. A first control circuit serves to adjust a heating current of the heating resistor for a resistance heating operation. The second control circuit serves to adjust an electron current from the heating resistor to the crucible for an electron beam heating operation. Both operating modes can be realized in a common control circuit; however, it is preferable to make separate control circuits available in order to avoid a mutual influencing of the resistance heating and of the electron beam heating.

In the control circuits the heating current and/or electron current of the heating resistor are generally controlled using an actual value selected as a function of the concrete task of the evaporator cell. For example, a measured evaporating rate can be used as the actual value for the control circuits. The control preferably takes place as a function of the operating temperature of the crucible. To this end, the temperature measuring device is connected to at least one of the control circuits.

A coating installation provided with at least one evaporator cell in accordance with the invention constitutes an independent subject matter of the invention. The evaporator cell can advantageously be arranged in the coating installation with the crucible aligned obliquely relative to the vertical.

As concerns the process, the invention is based on the general technical teaching of subjecting material to be evaporated in a crucible of an evaporator cell to an indirect heating, during which a resistance heating is provided in a first temperature range using a heating resistor and an electron beam heating of the crucible is provided in a second temperature range. The operating temperature of the evaporator cell is preferably measured in at least one of the temperature ranges in order to monitor the operating state of the evaporator cell and/or to control operating temperature. Predetermined portions of the resistance heating and electron beam heating can be advantageously adjusted in order to optimize the total performance as a function of the actual operating temperature.

BRIEF DESCRIPTION OF THE DRAWINGS

Further details and advantages of the invention are explained in the following with reference made to the attached drawings. The drawings show.

PREFERRED EMBODIMENTS OF THE INVENTION

Figure 1:
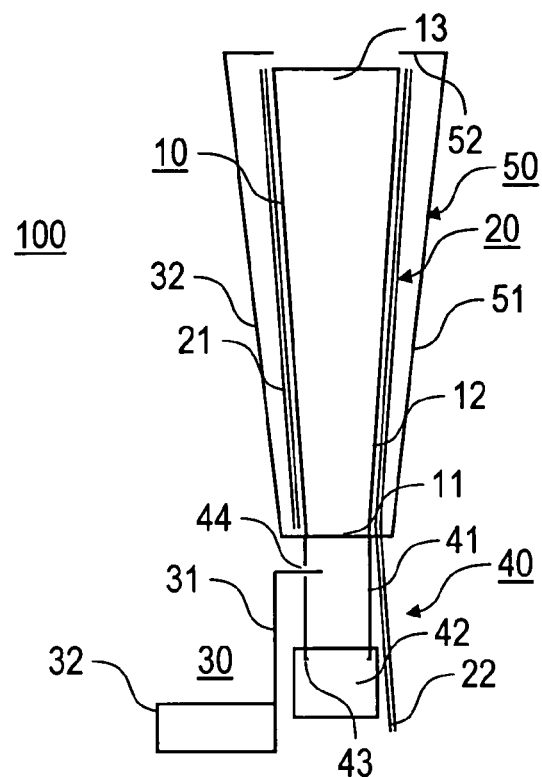
FIG. 1: a schematic sectional view of a first embodiment of the evaporator cell according to the invention.

The evaporator cell 100 shown in schematic sectional view in FIG. 1 comprises a crucible 10, a heating device 20, a temperature measuring device 30, a holding device 40 and a shielding device 50.

Crucible 10 for receiving material to be evaporated with crucible bottom 11, circumferential side wall 12 and outlet opening 13 has a conical form with a diameter that increases from crucible bottom 13 toward outlet opening 13. Crucible 13 consists of a single- or multilayer material that has a constant shape and is mechanically stable up to a temperature of 3400° C. Crucible 10 can consist completely of a metal sheet or of a composite with a non-electrically conductive base body and a metallic coating, the electrically conductive part of crucible 10 being connected to high-voltage source 24 (see FIG. 2) in order to operate the evaporator. Crucible 10 consists, e.g., completely of tantalum or of a tantalum-tungsten combination or of a tungsten-rhenium alloy. The tungsten-tantalum combination has, e.g., a construction with crucible bottom 11 consisting of tungsten and with side wall 12 of tantalum or has two-layer construction with an inner tungsten cone and an outer tantalum cone. The latter variant has the advantage that the outer tantalum sheet mechanically stabilizes the inner tungsten cone. The dimensions of crucible 10 are for an inside volume of around 10 cm$^3$, e.g.: diameter of the crucible bottom: 1 cm, axial length of crucible 10: around 10 to 15 cm, diameter of outlet opening 13: around 1.5 cm.

Figure 2:
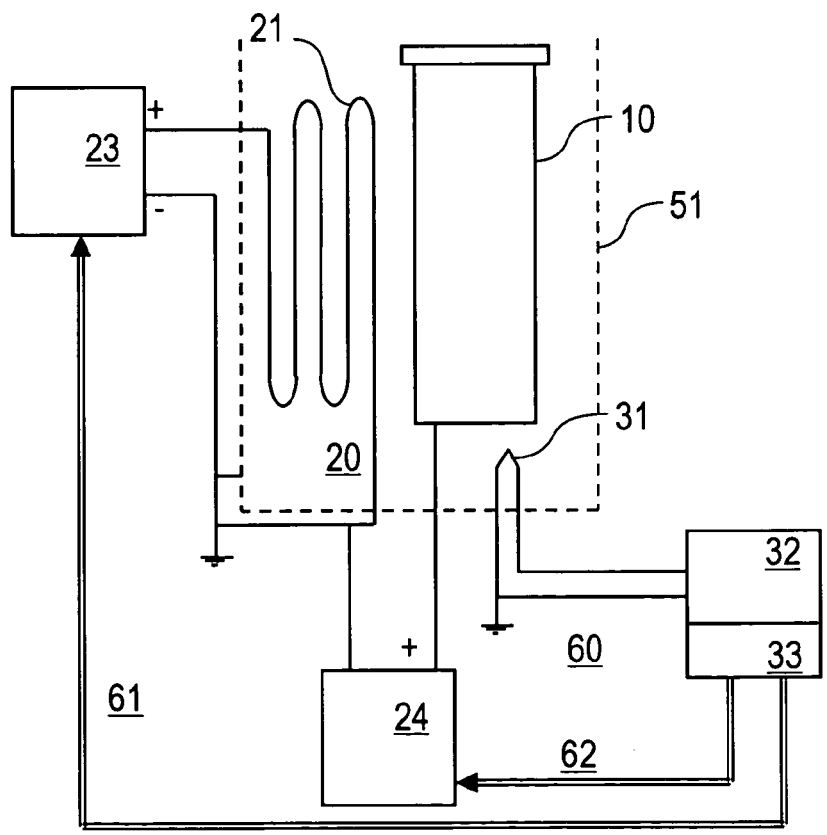
FIG. 2: the combination in accordance with the invention of the evaporator cell with a control device.

Heating device 20 comprises heating resistor 21 and connection line 22 connected to heating current source 23 (see FIG. 2). Heating resistor 21 is a resistance wire consisting of a material customary for resistance heatings such as, e.g., tungsten or tantalum with a diameter of, e.g., 0.635 mm. The heating resistor is arranged on the outside of side wall 12 at an interval from its surface. It forms a heating coil with, e.g., 12 lines oppositely aligned in pairs. The provision of paired lines advantageously reduces undesired magnetic fields when heating resistor 21 is loaded with operating current. Heating resistor 21 is mechanically held on the inside of shielding device 50, as is shown with further details in FIG. 4. The diameter of heating device 20 is, e.g., 20 mm.

Temperature measuring device 30 comprises a thermocouple 31 whose contact position is arranged below crucible bottom 11 and is connected to measuring converter 32. The thermocouple is, e.g., a tungsten-rhenium thermocouple as is described in the above-cited publication by R. R. Asamoto et al. Measuring transformer 32 is, e.g., of the "Eurotherm 2604" type.

Holding device 40 comprises a hollow cylinder 41 consisting of a temperature-resistant material, e.g., tantalum, with lateral opening 44. Thermocouple 31 can be introduced through opening 44 into the interior of hollow cylinder 41. The lower edge of hollow cylinder 41 is connected to a carrier 42 arranged stationarily or adjustably in a coating installation. Carrier 42 contains annular receptacle 43 in which the lower edge of hollow cylinder 41 is fastened. Holding device 40 serves for a stable holding and as electrical high-voltage contact of crucible 10. According to a modified variant of the invention the thermocouple can extend in an electrically insulated manner through carrier 42 into hollow cylinder 41.

Holding device 40 constitutes a thermal insulation between crucible 10 and the remaining parts on the coating installation. In order to minimize the thermal conduction, hollow cylinder 41 consists of a sheet with a thickness below 200 µm, preferably less than 500 µm, e.g., in the range of 50 µm to 200 µm.

Shielding device 50 comprises a lateral circumferential shielding wall 51 and shielding cap 52. Shielding wall 51 constitutes a thermal barrier to the outside and a mechanical holding for heating resistor 21 of the heating device. It consists, e.g., of Ta sheet with a thickness of 50 µm or of several layers of a Ta foil. Shielding cap 52 serves for the thermal insulation between evaporator cell 100 and a substrate to be coated. The gap between crucible 10 and shielding wall 51, in which heating resistor 23 is arranged, is shielded from the substrate by shielding cap 52. An opening is provided in the middle of shielding cap 52 that allows the vapor stream from crucible 10 to pass through to the substrate. The opening is selected to be as small as possible depending on the application (e.g., 15 mm) in order to improve the homogeneity of the temperature distribution in crucible 10 and to minimize the necessary heating power.

Figure 4:
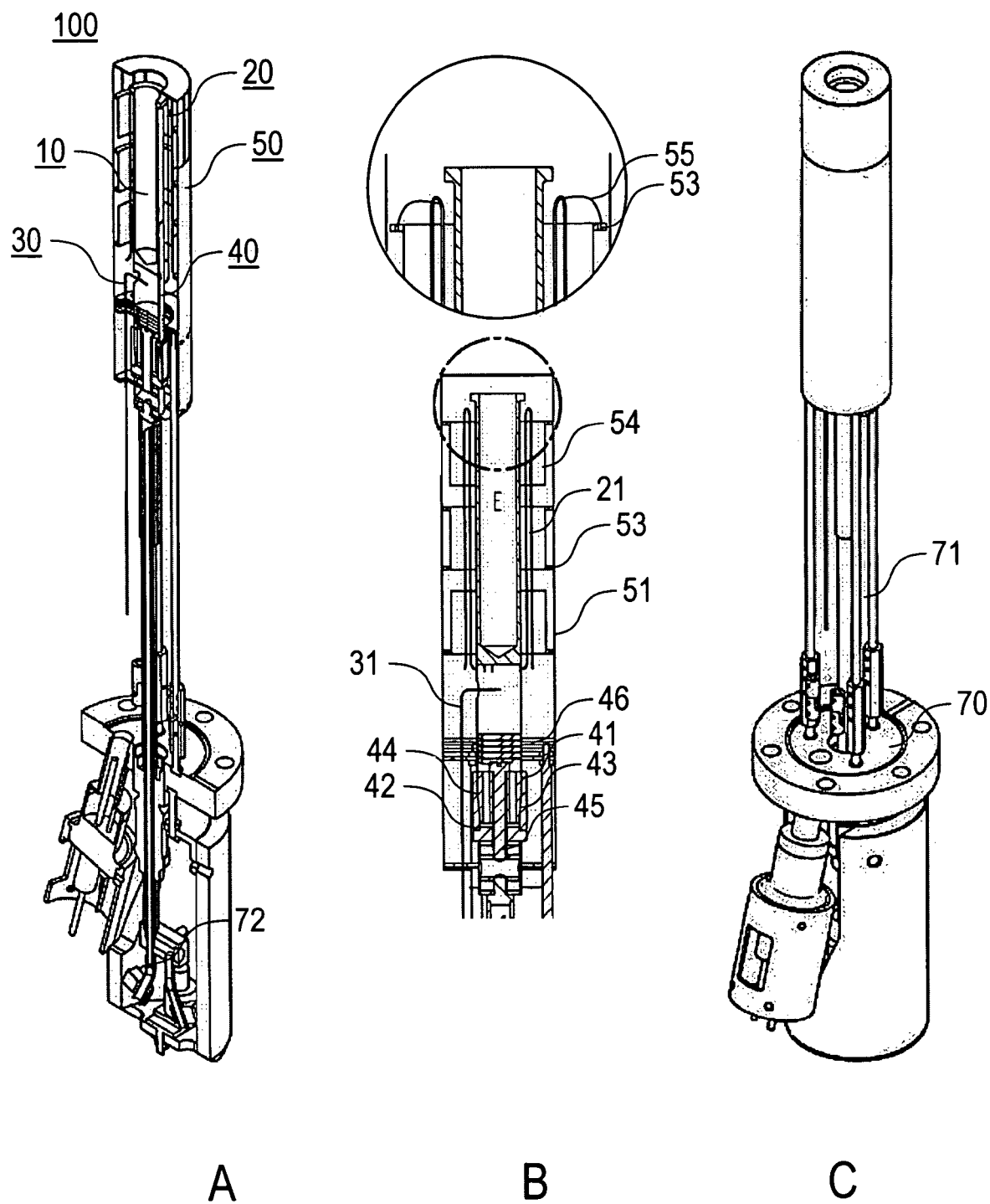
FIGS. 4A-4C: details of a further embodiment of a evaporator cell in accordance with the invention.

Heating device 20 is fastened in an electrically insulated manner to the inside of shielding device 50 (see FIG. 4). Shielding device 50 is fastened to an electrically insulating part of carrier 42 or to another stationary part of a coating installation (not shown). Shielding device 50 can additionally comprise an outer cooling shield (not shown) comprising, e.g., a double jacket cooled with liquid nitrogen or water.

The adjusting of the operating current of heating device 20 takes place with control device 60 whose parts are schematically shown in FIG. 2. Heating resistor 21 on the outside of crucible 10 is connected to heating current source 23. Heating current source 23 is a controllable power supply for a heating current up to 25 A at an output DC voltage up to 40 V. The one connection of heating current source 23 is connected to one end of heating resistor 21 whereas the other connection of heating current source 23 is connected jointly with the other end of heating resistor 21, the shielding wall 51, the negative connection of high-voltage source 24 and a connection of thermocouple 31 to mass potential. The grounding of thermocouple 31 is optionally provided. Alternatively, measuring converter 32 and controller 33 can be on crucible potential.

High-voltage source 24 is a controllable DC voltage power supply with an output current up to 10 A and an output voltage up to 500 V. The positive connection of high-voltage source 24 is connected via holding device 40 (see FIG. 1) to crucible 10, that represents the anode during the electron beam operation of heating device 20, onto which electrons from heating resistor 21 are accelerated. According to a modified variant of the invention the high voltage source can be designed for lower (e.g., around 300 V to around 50 V) or higher voltages (e.g., up to around 5000 V). In practice, lower voltages at currents that are correspondingly as high as possible are preferred in order to avoid electrical flashovers.

Measuring converter 32 of thermocouple 31 is connected to controller 33 (e.g., a PID controller) with two outputs. Adjusting signals are supplied from the outputs of controller 33 to heating current source 23 and high-voltage source 24.

Figure 3:
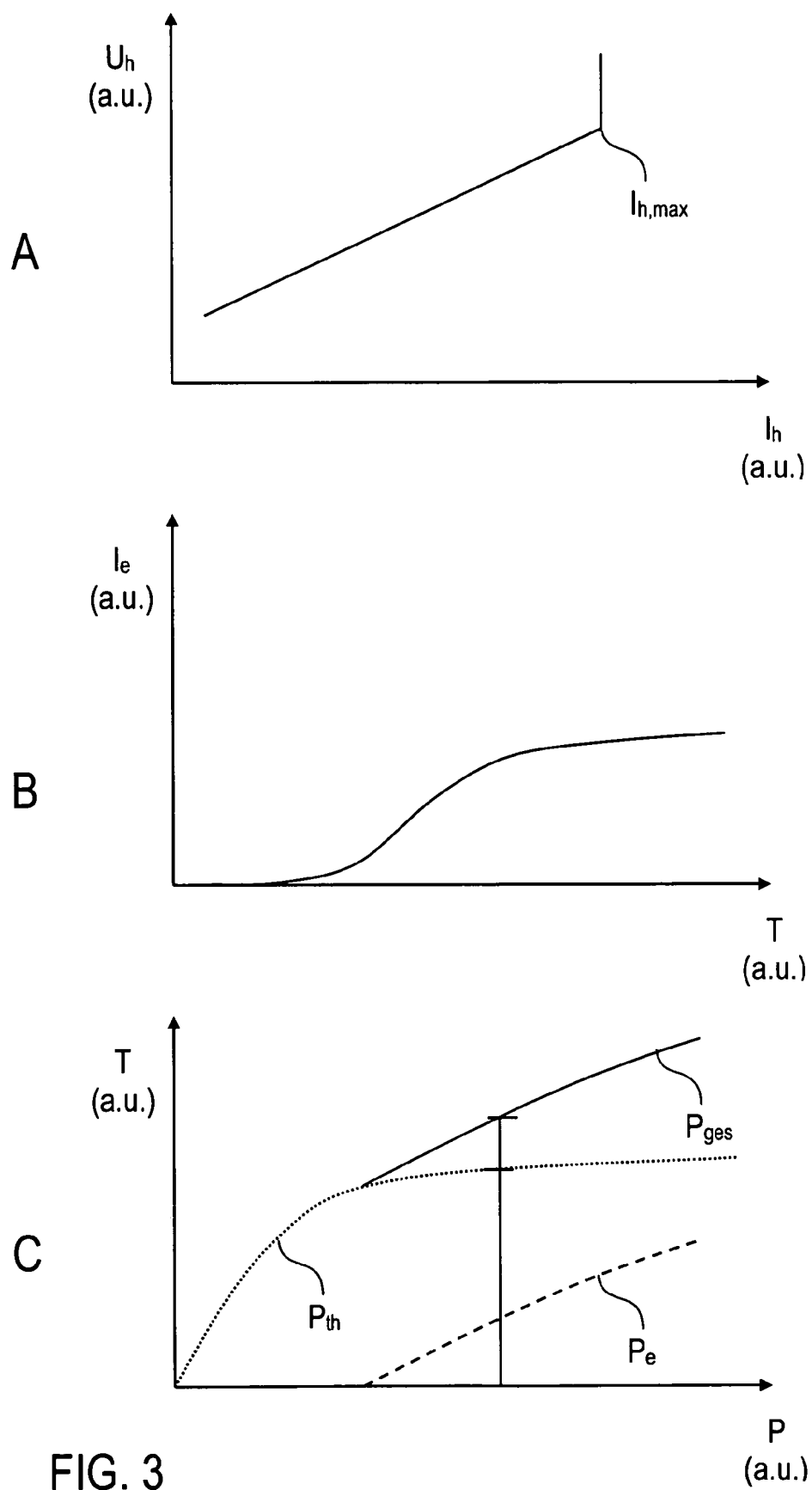
FIG. 3A-3C: representations of curves illustrating different operating states of the evaporator cell according to the invention.

Control device 60 comprises two control circuits. In the first control circuit 61 the heating current of heating current source 23 is controlled by heating resistor 21 as a function of the operating temperature of crucible 10. In the second control circuit 62 the electron current from heating resistor 21 to crucible 10 is also controlled as a function of the operating temperature of crucible 10. During the adjusting of the temperature the characteristic curves shown in FIGS. 3A to 3C are realized by way of example. In a first operating phase a loading of heating resistor 21 with heating current $I_h$ takes place at first. Heating current source 23 is operated with a current limitation. In resistance heating operation the heating performance and therewith the temperature of crucible 10 is regulated exclusively via heating voltage $U_h$ above a predetermined maximal current $I_{h,max}$ of, e.g., 12.5 A (and a voltage of 26 V), as is shown in FIG. 3A.

When a sufficiently high temperature of, e.g., 1500° C. is reached by the resistor heating, the electron beam heating is turned on in a further operating phase. The electron emission from heating resistor 21 to crucible 10 begins, e.g., already at a high voltage of 300 V. The temperature of crucible 10 also rises with the rising electron current $I_e$, as FIG. 3B schematically shows. A temperature or 2700° C. is achieved with a rise of the electron current to, e.g., 800 mA.

In order to obtain the smoothest possible transition of the temperature adjustment during the change from the resistance heating to the electron beam heating the high voltage of high-voltage source 24 is applied already during the first operating phase of resistance heating to crucible 10. According to FIG. 3C, temperature T in the crucible is at first raised by the thermal heating (dotted line, power $P_{th}$) by the first output of control device 33 until a temperature is achieved at which the electron emission from heating resistor 21 begins. The heating is superposed by the electron beam heating (in dashes, power $P_e$). Both portions add up to power $P_{total}$ (sketched in a solid line). For the further elevation of temperature, power $P_{th}$ of the resistance heating is not increased but rather the electron beam heating is used.

The vertical line in FIG. 3C illustrates that the portions of the power can be adjusted and optimized by the resistance heating and the electron beam heating in accordance with the invention in a predetermined manner. It can be advantageous, e.g., as a function of the concrete application of the evaporator cell, to limit the resistance heating at a rather low power and to strengthen the electron beam heating accordingly.

Further details of another embodiment of evaporator cell 100 are shown in FIGS. 4A (perspective sectional view), 4B (enlarged partial view) and 4C (perspective view). The essential difference between the embodiments of FIGS. 1 and 4 resides in the geometric form of crucible 10. For the rest, the details shown in FIG. 4 can also be realized in the embodiment of the invention shown in FIG. 1.

FIGS. 4A and 4B show crucible 10, heating device 20, temperature sensor 30, holding device 40 and shielding device 50. Crucible 10 is a straight hollow cylinder of tungsten sheeting. Shielding wall 51 consists of several layers of a tantalum foil. The heating wires of heating resistor 21 extend over the entire length of crucible 10. The electron emission also takes place with advantage in the electron beam heating along the entire length of heating resistor 21. The mechanical holding of heating resistor 21 is shown with further details in FIG. 4B. Annular metallic shields 54 are attached to the inside of shielding wall 51 by insulating rings 53. Gaps are between metallic shields 54 through which connecting wires 55 (see enlarged partial image in FIG. 4B) run for fixing heating resistor 21 to insulating rings 53. Heating resistor 21 is held by connecting wires 55 (e.g., of tantalum) in an electrically insulated manner from all other parts and in particular electrically insulated from crucible 10 and from metallic shields 54.

Hollow cylinder 41 of holding device 40 is tapered in a cone-like manner at its lower end. The conical tapering fits in a likewise conical receptacle 43 of carrier 42. The fixing of hollow cylinder 41 in holder 43 takes place with a likewise conical inner piece 44 that can be tightened into receptacle 43 of carrier 42 with tightening screw 45. According to an alternative variant tightening screw 45 can be hollow in its interior in order to run the thermocouple axially into the inner space of hollow cylinder 41. In the embodiment illustrated, thermocouple 31 is run through the lateral opening of hollow cylinder 41. Several layers of a tantalum sheet 46 are arranged on the top of carrier 42 in order to improve the thermal insulation between crucible 10 and carrier 42.

Carrier 42 is connected to base 70 via rigid ducts 71 in which the connection lines of the heating resistor, the high-voltage line of the crucible and the lines of the thermocouple are arranged. Furthermore, ducts 71 serve to cool the connection lines with cooling water supplied via cooling-water connections 72 (see FIG. 4A). Base 70 has a vacuum flange (e.g., size CF 40) that can be mounted on a coating installation.

The features of the invention disclosed in the above specification, the drawings and the claims can be significant for the realization of the invention in its various embodiments individually as well as in combination.

The invention claimed is:

1. A process for evaporating a high-melting material to be evaporated, with the steps:
   providing the material to be evaporated in a crucible, and heating the crucible, in which a resistance heating of the crucible is provided with a heating resistor of a heating device in a first temperature range during a first operating phase, and an electron beam heating of the crucible is provided with the heating resistor in a second higher temperature range during a second operating phase, thereby evaporating the high-melting material.

2. The process according to claim 1, in which the heating is provided on several sides of the crucible.

3. The process according to claim 1, in which an operating temperature of the evaporator cell is measured.

4. The process according to claim 3, in which the operating temperature of the evaporator cell is measured in the environment of a crucible bottom of the crucible.

5. The process according to claim 1, with the further step: adjusting the heating device with a control device.

6. The process according to claim 5, in which a resistance heating operation with a first control circuit is provided in the first operating phase.

7. The process according to claim 5, in which an electron beam heating operation with a second control circuit is provided in the second operating phase.

8. The process according to claim 6, in which a temperature signal of the temperature sensor is supplied at least to one of the first and second control circuits as control variable.

9. The process according to claim 7, in which a temperature signal of the temperature sensor is supplied at least to one of the first and second control circuits as control variable.

* * * * *